(12) United States Patent
Gaska et al.

(10) Patent No.: US 6,943,377 B2
(45) Date of Patent: Sep. 13, 2005

(54) LIGHT EMITTING HETEROSTRUCTURE

(75) Inventors: Remigijus Gaska, Columbia, SC (US); Michael S. Shur, Latham, NY (US)

(73) Assignee: Sensor Electronic Technology, Inc., Latham, NY (US)

(*) Notice: Subject to any disclaimer, the term of this patent is extended or adjusted under 35 U.S.C. 154(b) by 0 days.

(21) Appl. No.: 10/690,760

(22) Filed: Oct. 22, 2003

(65) Prior Publication Data

US 2004/0099869 A1 May 27, 2004

Related U.S. Application Data

(60) Provisional application No. 60/428,177, filed on Nov. 21, 2002.

(51) Int. Cl.[7] ............................................. H01L 27/15
(52) U.S. Cl. ......................... 257/79; 257/79; 257/94
(58) Field of Search ............................. 257/79, 94, 98, 257/99; 438/29; 372/50, 46, 96

(56) References Cited

U.S. PATENT DOCUMENTS

| | | | | |
|---|---|---|---|---|
| 5,466,950 A | * | 11/1995 | Sugawara et al. | 257/94 |
| 5,784,399 A | * | 7/1998 | Sun | 372/50 |
| 5,834,893 A | * | 11/1998 | Bulovic et al. | 313/506 |
| 6,233,267 B1 | * | 5/2001 | Nurmikko et al. | 372/46 |
| 6,320,893 B1 | * | 11/2001 | Ueki | 372/96 |
| 6,417,019 B1 | * | 7/2002 | Mueller et al. | 438/29 |
| 6,563,141 B1 | * | 5/2003 | Dawson et al. | 257/98 |
| 6,791,119 B2 | * | 9/2004 | Slater et al. | 257/99 |
| 6,803,603 B1 | * | 10/2004 | Nitta et al. | 257/79 |

OTHER PUBLICATIONS

"Introduction to Solid State Lighting," A. Zukausas et al., John Wiley & Sons, Inc., New York (2002), pp. 37–116.
"Improved Characteristics of InGaN Multiple–Quantum–Well Light–Emitting Diode by GaN/AlGaN Distributed Bragg Reflector Grown on Sapphire," N. Nakada et al., Applied Physics Letters, vol. 76, No. 14, Apr. 3, 2000, pp. 1804–1806.
"AlGaN Single–Quantum–Well Light Emitting Diodes With Emission at 285 nm," V. Adivarahan et al., Applied Physics Letters, vol. 81, No. 19, Nov. 4, 2002, pp. 3666–3668.
"Strain Energy Band Engineering Approach to AlN/GaN/InN Heterojunction Devices," A. Khan et al., Frontiers in Electronics: Future Chips Proceedings of the 2002 Workshop on Frontiers in Electronics (Wofe–02) St. Croix, Virgin Islands, World Scientific Pub Co; (Jan. 15, 2003), ISBN: 9812382224, vol. 26. Series Selected Topics in Electronics and Systems, pp. 195–214.
"A Vertical Injection Blue Light Emitting Diode in Substrate Separated InGaN Heterostructures," Y.–K. Song et al., Applied Physics Letters, vol. 74, No. 24, Jun. 14, 1999, pp. 3720–3722.

* cited by examiner

*Primary Examiner*—David Nelms
*Assistant Examiner*—Thinh T Nguyen
(74) *Attorney, Agent, or Firm*—John W. LaBatt; Hoffman, Warnick & D'Alessandro LLC

(57) ABSTRACT

An improved light emitting heterostructure. In particular, a nitride-based light emitting heterostructure is provided that includes a light generating structure and a distributed semiconductor heterostructure Bragg reflector structure formed above the light generating structure. In operation, the light generating structure generates light, a portion of which is reflected by the distributed semiconductor heterostructure Bragg reflector structure, thereby increasing the total amount of light that can be emitted from the heterostructure.

21 Claims, 4 Drawing Sheets

LIGHT EMITTING HETEROSTRUCTURE

REFERENCE TO PRIOR APPLICATION

The current application claims the benefit of co-pending U.S. Provisional Application No. 60/428,177, filed on Nov. 21, 2002, which is hereby incorporated herein by reference.

BACKGROUND OF THE INVENTION

1. Technical Field

The invention relates generally to nitride-based heterostructures, and more specifically, to an improved nitride-based light emitting heterostructure.

2. Related Art

Recently, nitride-based light emitting diodes and lasers that emit light in the blue and deep ultraviolet (UV) wavelengths have attracted a great deal of interest. These devices may be capable of being applied to various areas, including solid-state lighting, biochemical detection, high-density data storage, and the like. However, to date, the performance of nitride-based light emitting diodes and lasers quickly worsens as the radiation wavelength is reduced into the ultraviolet range. A significant barrier to more efficient performance in the higher frequencies is the efficiency with which light generated by the light generating portion of the devices is extracted. In particular, the extraction of light in these devices is frequently limited to a transparent substrate since the UV light is absorbed by the top layer. As a result, only a single path is provided for extracting the generated light, rather than two or more paths in other types of devices.

As a result, a need exists for a nitride-based light emitting heterostructure that more efficiently extracts light. In particular, a need exists for a light emitting heterostructure that includes a distributed semiconductor heterostructure Bragg reflector structure formed over the light generating structure.

SUMMARY OF THE INVENTION

The invention provides an improved light emitting heterostructure. Specifically, under the present invention, a distributed semiconductor heterostructure Bragg reflector (DBR) structure is formed above a light generating structure such as an ultraviolet (UV) light generating structure. In this manner, additional light is reflected for emission. For example, a transparent substrate can be used so that light is extracted out of the heterostructure through the transparent substrate. In this case, the DBR structure reflects additional light toward the transparent substrate than would otherwise be provided from the light generating structure. Additional structure(s) such as a reflective layer, a photonic crystal, a mirror, or the like can also be incorporated in the light emitting heterostructure to direct the generated light.

A first aspect of the invention provides a light emitting heterostructure comprising: a substrate; a light generating structure formed over the substrate; a distributed semiconductor heterostructure Bragg reflector (DBR) structure formed over the light generating structure; and a p-type layer formed over the DBR structure.

A second aspect of the invention provides a light emitting device comprising: a substrate; an n-type layer formed over the substrate; a light generating structure formed over the n-type layer; a distributed semiconductor heterostructure Bragg reflector (DBR) structure formed over the light generating structure; and a p-type layer formed over the DBR structure.

A third aspect of the invention provides an ultraviolet light emitting heterostructure comprising: an n-type layer; a light generating structure formed over the n-type layer; a distributed semiconductor heterostructure Bragg reflector (DBR) structure formed over the light generating structure; and a p-type layer formed over the DBR structure.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

It is understood that for the purposes of the present invention, Al means Aluminum, In means Indium, Ga means Gallium, and N means Nitrogen.

As indicated above, the invention provides an improved light emitting heterostructure. Specifically, under the present invention, a distributed semiconductor heterostructure Bragg reflector (DBR) structure is formed above a light generating structure such as an ultraviolet (UTV) light generating structure. In this manner, additional light is reflected for emission. For example, a transparent substrate can be used so that light is extracted out of the heterostructure through the transparent substrate. In this case, the DBR structure reflects additional light toward the transparent substrate than would otherwise be provided from the light generating structure. Additional structure(s) such as a reflective layer, a photonic crystal, a mirror, or the like can also be incorporated in the light emitting heterostructure to direct the generated light.

Figure 1:
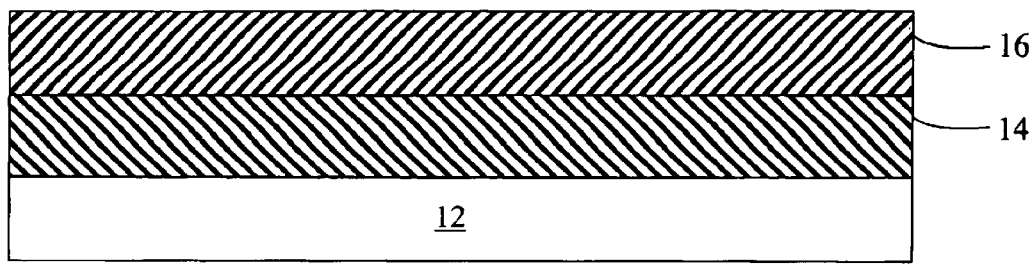
FIG. 1 shows an illustrative light emitting heterostructure according to one embodiment of the invention.

Turning to the drawings, FIG. 1 shows an illustrative light emitting heterostructure 10 according to one embodiment of the invention. Heterostructure 10 is shown including a substrate 12, a light generating (active) structure 14 formed over substrate 12, and a distributed Bragg reflector (DBR) structure 16 formed over light generating structure 14. In one embodiment, substrate 12 comprises a transparent substrate that allows light, e.g., UV light, generated by light generating structure 14 to be extracted through substrate 12 and emitted to the exterior of heterostructure 10. To improve the efficiency of light emitting heterostructure 10, DBR structure 16 is formed over light generating structure 14, and can reflect additional light generated by light generating structure 14 toward substrate 12.

Substrate 12 can comprise any material known in the art including, for example, sapphire, silicon carbide, aluminum nitride, gallium nitride, zinc oxide, lithium gallate, lithium niobate, diamond, silicon, or the like. Similarly, light generating structure 14 can comprise any known structure for generating light, e.g., an AlGaInN quantum well structure that generates UV light, or the like. To this extent, light generating structure 14 can comprise one or more layers that generate light in a particular range of frequencies (e.g., in a light emitting diode), or light of a particular frequency that is also aligned in a particular manner (e.g., in a laser). DBR structure 16 comprises alternating layers of high and low refractive index materials having an optical thickness of approximately one quarter of the desired wavelength of the emitted light. As the number of layers and/or difference in refractive indices between layers increases in DBR structure 16, an increasing amount of light generated by light generating structure 14 will be reflected, i.e., DBR structure 16 will have a higher reflectivity.

It is understood that throughout the drawings, each layer shown can be deposited directly on an adjacent, lower layer or one or more additional layers can be formed between the two adjacent layers shown. The composition and configuration of any additional layers and/or components will vary depending on the device for which light emitting heterostructure 10 will be used and/or any improvements made to enhance the operation and/or reliability of the device. To this extent, light emitting heterostructure 10 could include one or more additional layers and/or components for wave guiding, alignment of wavelengths (e.g., one or more mirrors), or the like. Further, each layer can be formed over all or only a portion of a lower layer, can vary in thickness, and can be formed into any pattern that provides the desired functionality for light emitting heterostructure 10. Each layer can be deposited and/or patterned using any solution now known or later developed. For example, each nitride-based layer can be formed using Molecular Beam Epitaxy (MBE) and/or patterned using selective etching.

Figure 2:
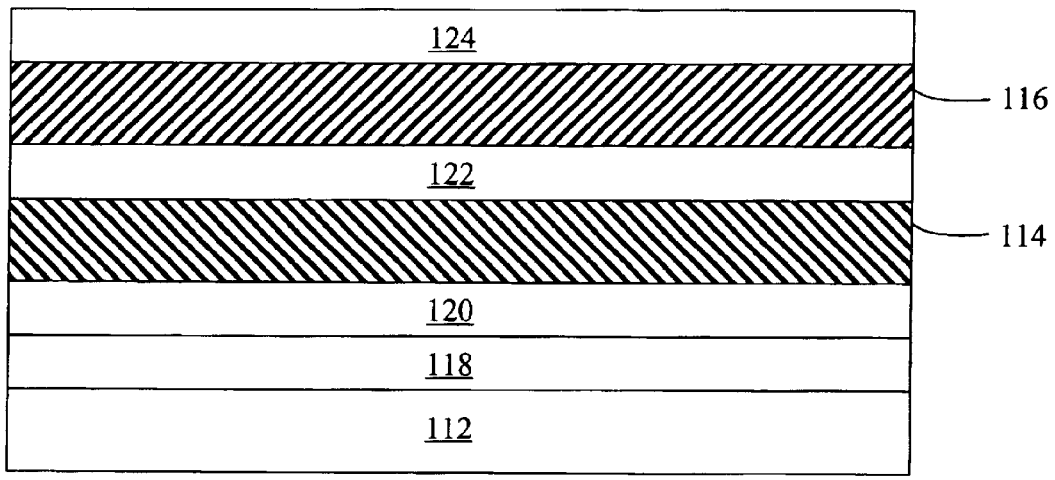
FIG. 2 shows an illustrative light emitting heterostructure according to another embodiment of the invention.

As noted, light emitting heterostructure 10 can include various additional layers. For example, FIG. 2 shows an illustrative light emitting heterostructure 110A that includes a substrate 112, a light generating structure 114 formed above substrate 112, and a DBR structure 116 formed above light generating structure 114. Heterostructure 110A also includes a buffer layer 118 formed on substrate 112, an n-type layer 120 formed on buffer layer 118, an electron blocking layer 122 formed between light generating structure 114 and DBR structure 116, and a p-type layer 124 formed on DBR structure 116. Buffer layer 118 can comprise a crystalline or amorphous nitride-based layer, and n-type layer 120 could comprise a doped layer.

In one embodiment, substrate 112 comprises a silicon carbide transparent substrate, buffer layer 118 comprises AlN, n-type layer 120 comprises AlGaInN, light generating structure 114 comprises an AlGaInN quantum well structure, electron blocking layer 122 comprises AlGaN or AlGaInN, DBR structure 116 comprises alternating layers of AlN/GaN/InN based heterostructures, and p-type layer 124 comprises GaN. However, it is understood that each layer can comprise any type of nitride-based compound, including AlN, GaN, InN, AlGaN, InGaN, AlGaInN, or the like. Further, it is understood that the embodiment shown is only illustrative, and one or more alternative and/or additional layers could be included. For example, a strain control superlattice layer could be formed between substrate 112 and n-type layer 120.

Figure 3:
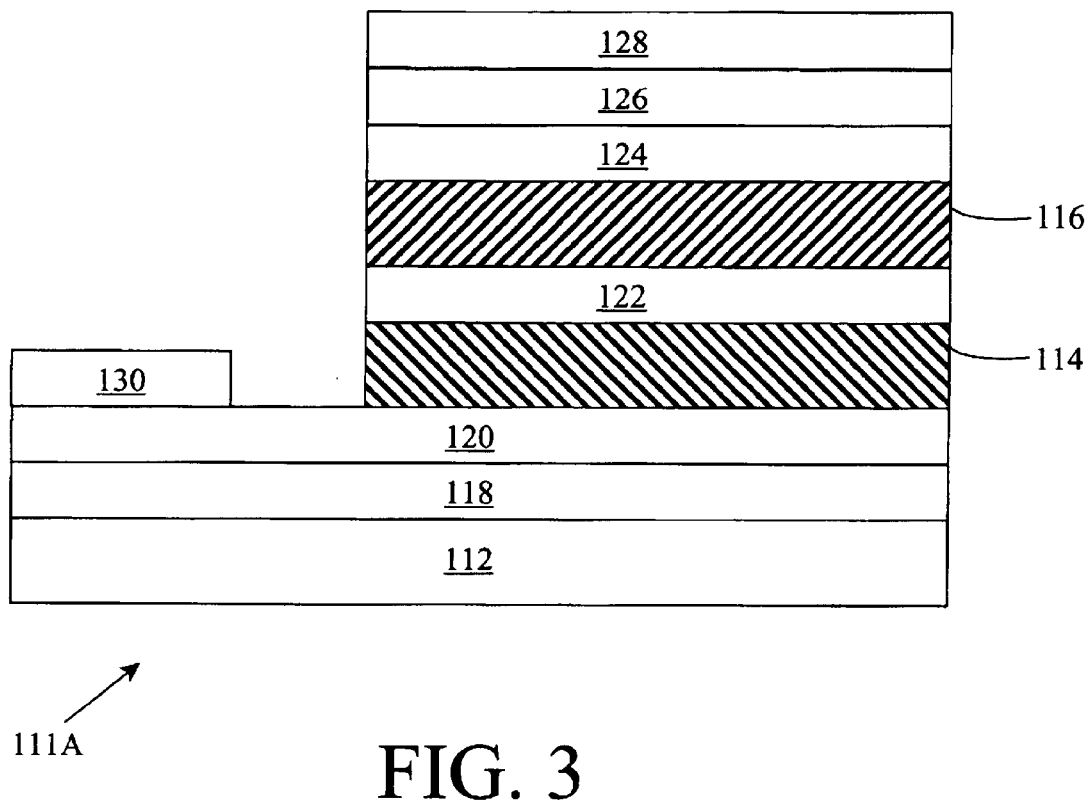
FIG. 3 shows an illustrative light emitting device according to one embodiment of the invention.

Light emitting heterostructure 110A can be configured to operate as any type of light emitting device, such as an ultraviolet light emitting diode (LED), an LED emitting at several wavelengths, a laser, or the like. For example, FIG. 3 shows an illustrative LED 111A created using light emitting heterostructure 110A (FIG. 2). In addition to the various layers from light emitting heterostructure 110A, a p+ contact layer 126 is shown formed on p-type layer 124, a metal layer 128 is shown formed on contact layer 126, and an n-type contact layer 130 is shown formed on n-type layer 120. Contact layer 126 can be a current blocking layer comprising any type of nitride-based compound, including AlN, GaN, InN, AlGaN, InGaN, AlGaInN, or the like. Metal layer 128 and n-type contact layer 130 can each comprise any type of metallic compound typically used in electrodes or the like used to provide an interface for operating the LED.

Figure 4:
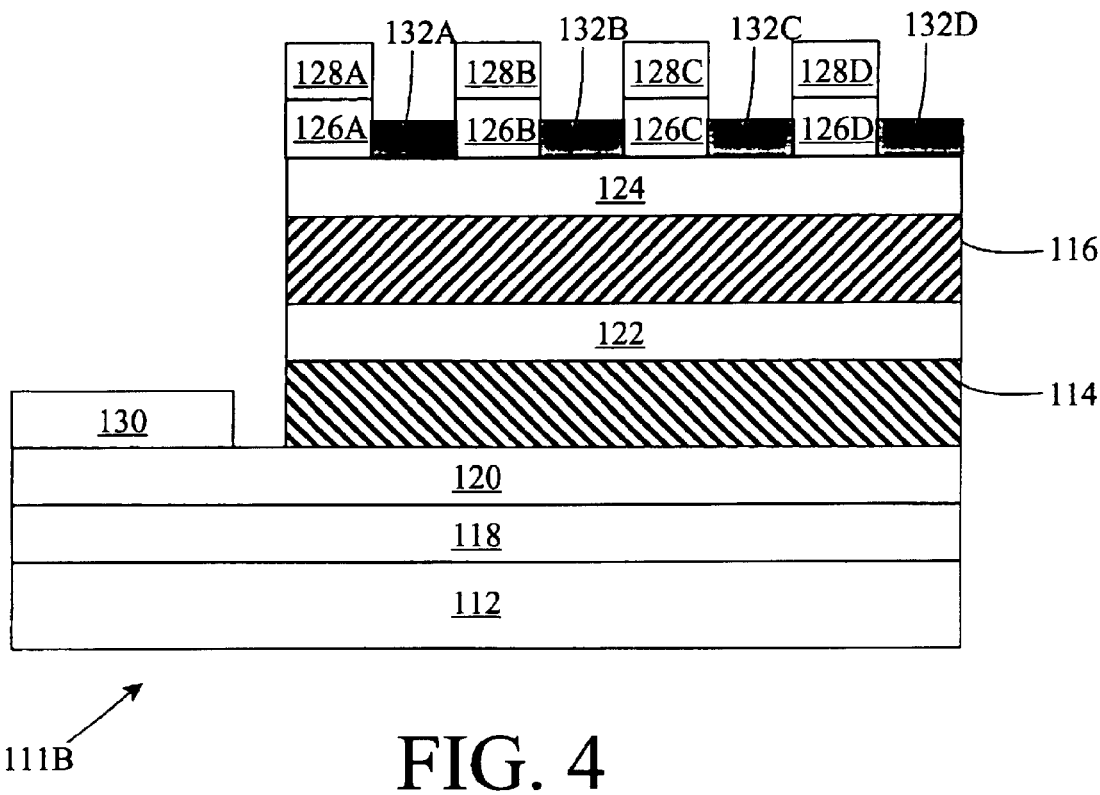
FIG. 4 shows an alternative light emitting device according to another embodiment of the invention.
Figure 5:
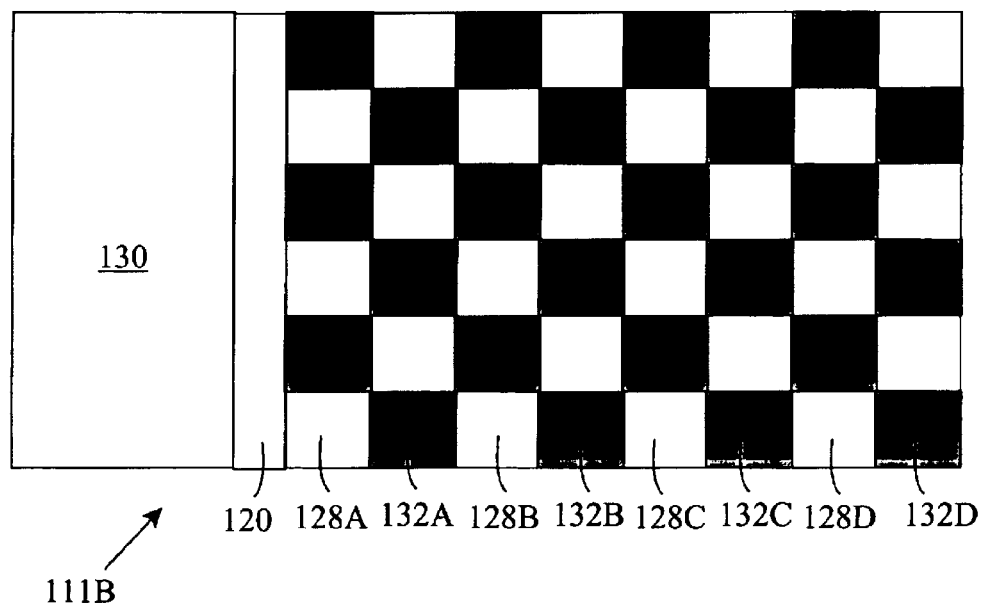
FIG. 5 shows a top view of the light emitting device shown in FIG. 4.

As noted previously, one or more layers and/or components can be formed into a pattern. For example, FIG. 4 shows a side view and FIG. 5 a top view of an alternative LED 111B in which contact layer 126 and metal layer 128 are formed into a set of squares 126A–D, 128A–D, respectively, that form a "checkerboard" pattern on LED 111B. Further, a current spreading metal reflective layer 132 is formed on p-type layer 124, and into a set of squares 132A–D that is adjacent and complementary to set of squares 126A–D. In this case, reflective layer 132 further enhances light extraction through, for example, substrate 112 by reflecting light generated by light generating structure 114 toward substrate 112 for the area covered by set of squares 132A–D, thereby avoiding absorption of all the light in contact layer 126. It is understood that various other patterns could be formed. For example, contact layer 126 and metal layer 128 could form alternating sets of stripes with reflective layer 132.

Figure 6:
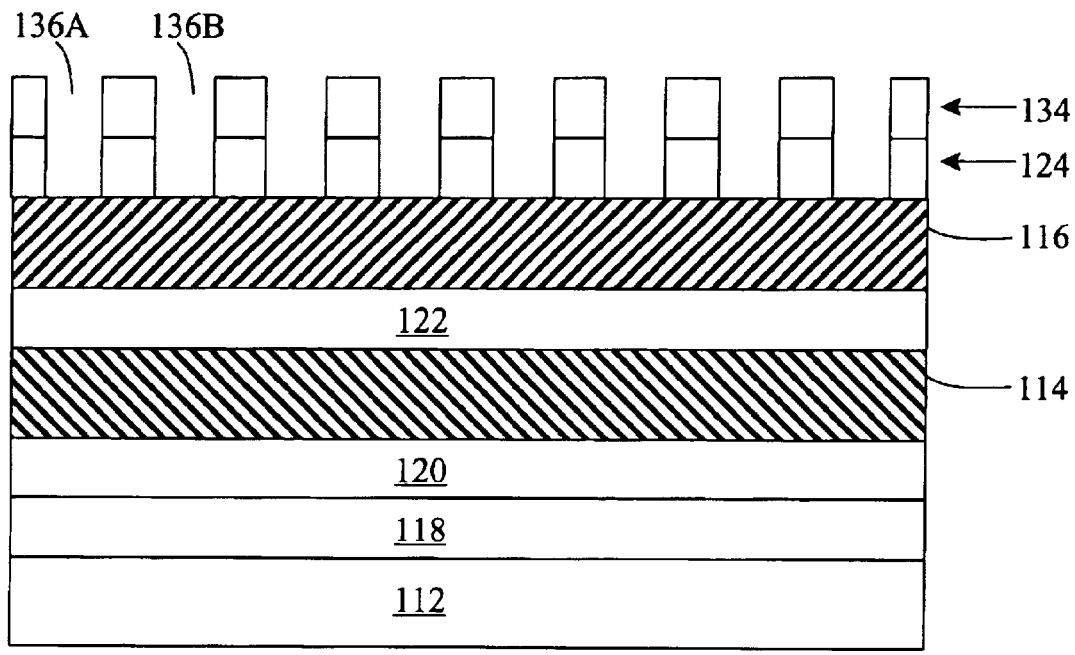
FIG. 6 shows yet another light emitting heterostructure according to still another embodiment of the invention.
Figure 7:
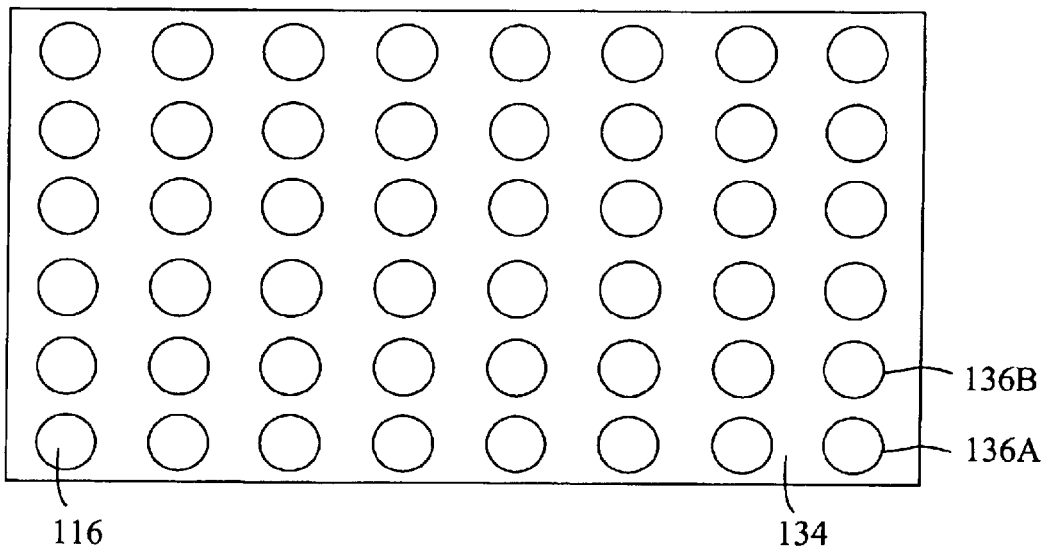
FIG. 7 shows a top view of the light emitting heterostructure shown in FIG. 6.

Other layers and/or structures can also be incorporated to further enhance light extraction out of the light emitting heterostructure. For example, FIG. 6 shows a side view and FIG. 7 shows a top view of an illustrative light emitting heterostructure 110B. Heterostructure 110B can include the same layers as heterostructure 110A (FIG. 2) with the addition of an anodized aluminum crystal 134 formed above contact layer 124. Anodized aluminum crystal 134 and contact layer 124 can include a set of holes 136A–B that form a photonic crystal. The configuration and periodicity of set of holes 136A–B can vary based on the parameters of the anodization process. Inclusion of anodized aluminum crystal 134 can enhance the light extraction through, for example, substrate 112 by reflecting light generated by light generation structure 114 toward substrate 112.

Various alternative configurations of the illustrative light emitting heterostructures and/or LEDs are possible. For example, the photonic crystal discussed with reference to FIGS. 6 and 7 could be formed by a set of holes 136A–B in an etched p-type contact layer 124, without the use of anodized aluminum crystal 134. Further, one or more holes in set of holes 136A–B could be filled with material having a different refractive index such as p-type GaN or AlInGaN, metal, or the like. In this case, the filled holes would provide periodic surface roughening that would assist in trapping light generated by light generation structure 114, and reflecting it toward substrate 112.

The foregoing description of various embodiments of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A light emitting heterostructure comprising:
   a substrate;
   a light generating structure formed over the substrate;
   an electron blocking layer formed over the light generating structure, wherein the electron blocking layer allows light to pass therethrough;
   a distributed semiconductor heterostructure Bragg reflector (DBR) structure formed over the electron blocking layer; and
   a p-type layer formed over th DBR structure.

2. The heterostructure of claim 1, further comprising:
   a buffer layer formed on the substrate; and
   a second layer formed on the buffer layer, wherein the light generating structure is formed on the second layer.

3. The heterostructure of claim 2, further comprising a contact layer formed on the second layer.

4. The heterostructure of claim 1, further comprising a contact layer formed above the DBR structure.

5. The heterostructure of claim 4, further comprising a metal layer formed on the contact layer.

6. The heterostructure of claim 1, further comprising an anodized aluminum layer formed over the DBR structure.

7. The heterostructure of claim 6, wherein the anodized aluminum layer forms a photonic crystal.

8. The heterostructure of claim 1, further comprising a reflective layer formed over the DBR structure.

9. The heterostructure of claim 1, wherein the substrate comprises a transparent substrate.

10. A light emitting device comprising:
    a substrate;
    an n-type layer formed over the substrate;
    a light generating structure formed over the n-type layer;
    an electron blocking layer formed over the light generating structure, wherein the electron blocking layer allows light to pass therethrough;
    a distributed semiconductor heterostructure Bragg reflector (DBR) structure formed over the electron blocking layer; and
    a p-type layer formed over th DBR structure.

11. The device of claim 10, further comprising a reflective layer formed on the p-type layer.

12. A light emitting device comprising:
    a substrate;
    an n-type layer formed over the substrate;
    a light generating structure formed over the n-type layer;
    a distributed semiconductor heterostructure Bragg reflector (DBR) structure formed over the light generating structure;
    a p-type layer formed over DBR structure;
    a reflective layer formed on the p-type layer; and
    a contact layer formed on the p-type layer, wherein the reflective layer and the contact layer form at least one of a set of alternating stripes or a set of alternating squares.

13. The device of claim 10, further comprising:
    a first contact formed on the n-type layer; and
    a second contact formed above the p-type layer.

14. The device of claim 10, wherein the device comprises at least one of a light emitting diode (LED), an ultraviolet LED, or a laser.

15. An ultraviolet light emitting heterostructure comprising:
    an n-type layer;
    a light generating structure formed over the n-type layer;
    an electron blocking layer formed over the light generating structure, wherein the electron blocking layer allows light to pass therethrough;
    a distributed semiconductor heterostructure Bragg reflector (DBR) structure formed over the electron blocking layer; and
    a p-type layer formed over the DBR structure.

16. The heterostructure of claim 15, further comprising an anodized aluminum layer formed over the p-type layer.

17. The heterostructure of claim 16, wherein the anodized aluminum layer and the p-type layer include a set of holes that form a photonic crystal.

18. The heterostructure of claim 15, wherein the p-type layer includes a set of holes.

19. The heterostructure of claim 18, wherein at least some of the set of holes is filled with a material having a different refractive index than the p-type layer.

20. The heterostructure of claim 15, further comprising a substrate, wherein the n-type layer formed over the substrate.

21. The heterostructure of claim 1, further comprising an n-type layer formed over the substrate, wherein the light generating structure is formed over the n-type layer.

* * * * *